United States Patent
Yamazaki et al.

(10) Patent No.: US 6,225,185 B1
(45) Date of Patent: May 1, 2001

(54) METHOD FOR FABRICATING SEMICONDUCTOR MEMORY HAVING GOOD ELECTRICAL CHARACTERISTICS AND HIGH RELIABILITY

(75) Inventors: Shinobu Yamazaki, Tenri; Kazuya Ishihara, Souraku-gun, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/427,941

(22) Filed: Oct. 27, 1999

(30) Foreign Application Priority Data

Oct. 30, 1998 (JP) .................................................. 10-309292

(51) Int. Cl.⁷ .................................................. H01L 21/20
(52) U.S. Cl. ............................................. 438/396; 438/3
(58) Field of Search ........................... 438/238, 396, 438/240, 3, 253, 397; 365/145; 257/295

(56) References Cited

U.S. PATENT DOCUMENTS 5,638,319 * 6/1997 Onishi et al. ......................... 365/145
5,858,851 * 1/1999 Yamagata et al. .................... 438/396
6,027,947 * 2/2000 Evans et al. ............................. 438/3

FOREIGN PATENT DOCUMENTS 8-335673   12/1996  (JP) .
9-331031   12/1997  (JP) .

* cited by examiner

Primary Examiner—Matthew Smith
Assistant Examiner—Calvin Lee
(74) Attorney, Agent, or Firm—Nixon & Vanderhye P.C.

(57) ABSTRACT

After forming a capacitor of a stack type ferroelectric memory device by sequentially patterning an upper electrode, a ferroelectric film and a lower electrode formed above an interlayer insulator film, the capacitor is covered with an oxidation barrier layer. After forming the oxidation barrier layer, the in-process memory device is heat treated at a high temperature in an oxygen-containing atmosphere. The oxidation barrier layer prevents the lower electrode of the capacitor and a barrier metal film between the capacitor and the interlayer insulator film from oxidation during heat treatment. Thus, the occurrence of peelings and hillocks in the lower electrode and the barrier metal film is avoided so that a semiconductor memory has good electrical characteristics and high reliability.

3 Claims, 5 Drawing Sheets

METHOD FOR FABRICATING SEMICONDUCTOR MEMORY HAVING GOOD ELECTRICAL CHARACTERISTICS AND HIGH RELIABILITY

BACKGROUND OF THE INVENTION

The present invention relates to a method for fabricating semiconductor memories and, in particular, to a method for fabricating a semiconductor memory using a ferroelectric capacitor as a charge storage capacitor.

Ferroelectrics typified by $Pb(Zr_xTi_{1-x})O_3$ (hereinafter, expressed as "PZT") or $SrBi_2Ta_2O_9$ (hereinafter, expressed as "SBT"), by virtue of their having high dielectric constant and spontaneous polarization, have been being developed for applications to large capacity DRAMs and nonvolatile memories. For implementation of high density semiconductor memories using ferroelectrics, it is necessary to form stack type memory cells.

The stack type memory cell is a structure that an underlayer selective transistor and a charge-storage capacitor are connected to each other via a contact plug. When polysilicon with impurities diffused therein at high concentration is used as the contact plug (hereinafter, referred to as "polysilicon plug"), platinum, iridium, iridium oxide or the like used for a lower electrode of the ferroelectric capacitor reacts with silicon, making it impossible to obtain a stable contact resistance. Due to this, a diffusion barrier layer of titanium nitride or the like is provided so as to suppress the reaction between lower electrode and silicon.

Meanwhile, a ferroelectric film, when subjected to semiconductor fabricating process such as etching process, suffers serious damage due to the process so that its ferroelectric characteristics considerably deteriorates. For example, in dry etching process, while the substrate is exposed to charged particles, there occur various electrification phenomena, which causes deterioration of dielectric characteristics or insulating characteristics of the ferroelectric film. Further, wet etching process such as cleaning also causes deterioration of the dielectric characteristics or insulating characteristics of the ferroelectric film.

The damage due to these processes is normally recovered to the initial state by carrying out heat treatment in a high-temperature oxygen-containing atmosphere of about 500–700° C. A cross-sectional structure after the processing of the lower electrode and the barrier metal is shown in FIG. 6.

In FIG. 6, reference numeral 21 denotes a silicon substrate, 22 denotes LOCOS (local oxidation of silicon) oxide for device isolation, 23 denotes gate oxide, 24 denotes a gate electrode, 25 denotes source and drain regions of a transistor, 26 denotes a first interlayer insulator, 27 denotes a polysilicon plug, 28 denotes a barrier metal, for example, a nitride of a tantalum and silicon alloy (TaSiN), 29 denotes a lower electrode, for example, iridium, 30 denotes an SBT film, which is a ferroelectric film, 31 denotes an upper platinum electrode, and 32 denotes oxidized portions of the lower electrode and the barrier metal.

In the state that the processing for up to the lower electrode and the barrier metal layer has been done, it is impossible to carry out heat treatment in a high-temperature oxygen-containing atmosphere. That is, the barrier metal of titanium nitride or tantalum nitride, tungsten nitride, TaSiN or a nitride of a titanium-silicon alloy (TiSiN) or the like and the lower electrode of iridium or the like are easily oxidized during the heat treatment in an oxygen-containing atmosphere (portions indicated by numeral 32 in FIG. 6).

Therefore, the lower electrode 29 or the barrier metal 28, when subjected to heat treatment in the exposed state, is easily oxidized, incurring volume expansion or cohesion, which causes hillocks or peelings or impairment of electrical conduction between contact plug and lower electrode, thus making it impossible to carry out the heat treatment in an oxygen-containing atmosphere.

To avoid this problem, it has conventionally been practiced to carry out heat treatment in an inert gas atmosphere such as nitrogen.

However, heat treatment in an inert gas atmosphere could not allow the capacitor to recover enough. As a result, a ferroelectric capacitor obtained would be poor in electrical characteristics and exhibit unstable behavior, with the result of lower yields. In order to obtain a ferroelectric capacitor having good electrical characteristics and high reliability, it is essential to carry out heat treatment in a high-temperature oxygen-containing atmosphere without causing volume expansion or cohesion due to the oxidation of the lower electrode and the barrier metal.

SUMMARY OF THE INVENTION

The present invention having been accomplished in view of the above problems, an object of the invention is to obtain a ferroelectric capacitor having good electrical characteristics and high reliability by carrying out a high-temperature heat treatment in an oxygen-containing atmosphere after the processing of the lower electrode and the formation of the oxidation barrier layer and, thereby, preventing the volume expansion and cohesion.

In order to achieve the above-mentioned object, the present invention provides a method for fabricating a semiconductor memory in which a transistor is formed on a semiconductor substrate, an interlayer insulator film is formed on the transistor, a contact plug is formed in the interlayer insulator film, a lower electrode film, a ferroelectric film as a capacitor insulator film and an upper electrode film are formed above the interlayer insulator film including the contact plug, a capacitor is formed by sequentially patterning the upper electrode film, the ferroelectric film and the lower electrode film, and the capacitor and the transistor are electrically connected to each other with the contact plug, comprising the steps of forming an oxidation barrier layer on the capacitor in such a manner that at least the capacitor is covered with the oxidation barrier layer after forming the capacitor, and heat treating the in-process semiconductor memory in an oxygen-containing atmosphere after forming the oxidation barrier layer on the capacitor.

By adopting the above method, it becomes possible to recover ferroelectric characteristics without causing oxidation of the lower electrode and the barrier metal.

In an embodiment of the present invention, the oxidation barrier layer is composed of an oxide of at least one or more kinds of elements out of titanium and tantalum, or silicon nitride.

In an embodiment of the present invention, film thickness of the oxidation barrier layer is 250 Å or more and 500 Å or less.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail based on embodiments thereof.

Figure 1A:
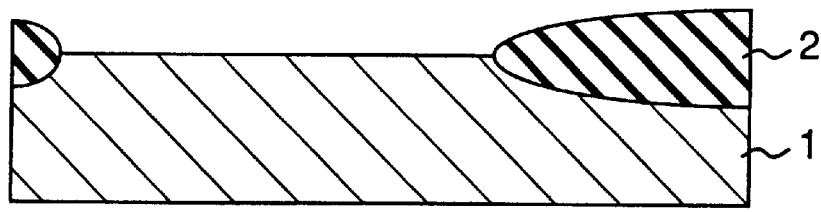
FIGS. 1A, 1B, 1C are partial sectional views of fabricating process of a semiconductor memory according to a first embodiment of the present invention.

FIGS. 1 to 3 are fabricating process diagrams of a semiconductor memory according to a first embodiment of the present invention. In FIGS. 1 to 3, reference numeral 1 denotes a silicon substrate, 2 denotes LOCOS oxide, 3 denotes gate oxide, 4 denotes a gate electrode, 5 denotes source and drain regions, 6 denotes a first interlayer insulator, 7 denotes a polysilicon plug, 8 denotes a TaSiN film as a barrier metal layer, 9 denotes an iridium film as a lower electrode of a capacitor, 10 denotes an SBT film as a ferroelectric film, 11 denotes a platinum film as an upper electrode of the capacitor, 12 denotes titanium oxide as an oxidation barrier layer, 13 denotes a second interlayer insulator , 14 denotes a platinum film as a drive line, 15 denotes a third interlayer insulator, and 16 denotes an aluminum interconnection.

The substrate used for the semiconductor memory having a ferroelectric capacitor in the present invention, although not particularly limited only if usable as a substrate for ordinary semiconductor memories or integrated circuits or the like, yet is preferably a silicon substrate.

(First Embodiment)

Process for fabricating a semiconductor memory having a ferroelectric capacitor of a first embodiment of the present invention is explained below with reference to FIGS. 1 to 3.

Figure 1B:
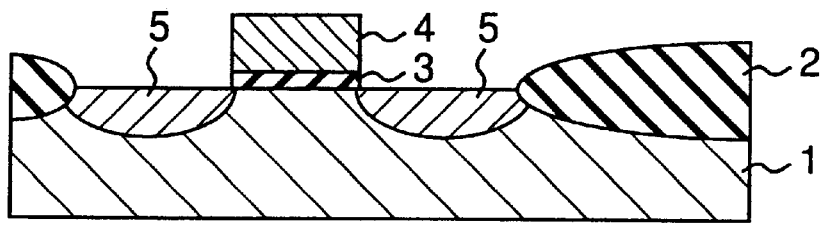

First, the LOCOS oxide 2 for device isolation is formed to 6000 Å in thickness on the p-type silicon substrate 1. Then, the gate oxide 3 is formed by oxidizing the surface of the silicon substrate 1 (FIG. 1A), and on top of the gate oxide 3, the gate electrode 4 made of polysilicon with impurities injected therein is formed, and the source and drain regions 5 are further formed by ion injection (FIG. 1B).

Figure 1C:
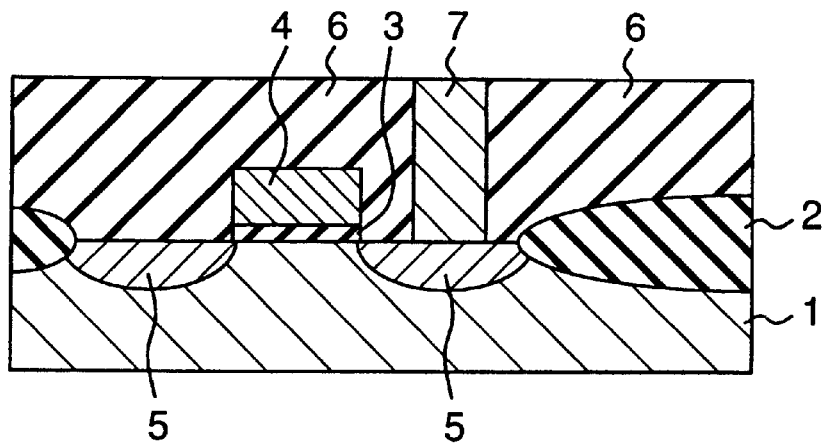

Next, over the whole surface of the silicon substrate 1, silicon oxide is formed as the first interlayer insulator 6 by CVD process. Then, a contact hole is opened in the drain region of the underlayer transistor, and the polysilicon plug 7 with impurities diffused therein is buried into the contact hole. Subsequently, surfaces of the interlayer insulator 6 and the polysilicon plug 7 are flattened by known CMP (Chemical Mechanical Polishing) process, by which the polysilicon plug 7 is formed in the contact hole (FIG. 1C).

The TaSiN film 8 is formed to 1000 Å in thickness as a barrier metal layer on the polysilicon plug 7 by DC magnetron sputtering process, and then the iridium film 9 is formed to 1500 Å in thickness as a lower electrode also by the DC magnetron sputtering process. After that, the SBT film 10 is formed as a ferroelectric film. The SBT film 10 is formed by MOD (Metal Organic Decomposition) process, i.e., a process for obtaining the SBT film 10 by iterating a sequence of steps of applying, drying, and crystallization heat-treating an organic metal solution containing strontium, bismuth and tantalum up to a desired thickness of the SBT film 10.

In this embodiment, an MOD solution having a composition ratio of Sr:Bi:Ta=8:24:20 is applied so that one layer may become about 500 Å in thickness, followed by drying at 250° C. for 5 minutes, and then a crystallization heat treatment at 675° C. for 60 minutes is carried out in a normal-pressure oxygen-containing atmosphere. The sequence of steps from the application to the heat treatment in the normal-pressure oxygen-containing atmosphere is iterated for each application, and by executing four times of application, the SBT film 10 with a film thickness of about 2000 Å is formed.

Figure 2A:
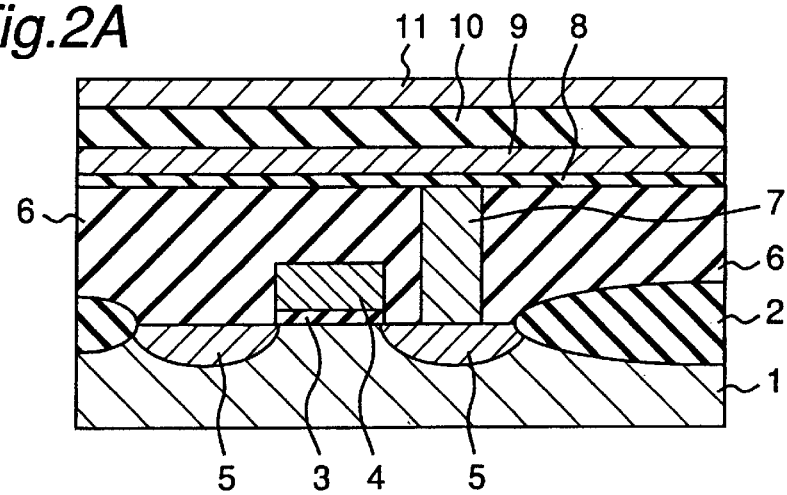
FIGS. 2A, 2B, 2C are partial sectional views of the fabricating process of a semiconductor memory according to the first embodiment of the present invention.

Further, the platinum film 11 is formed as an upper electrode to 1000 Å in thickness by the DC magnetron sputtering process (FIG. 2A).

Figure 2B:
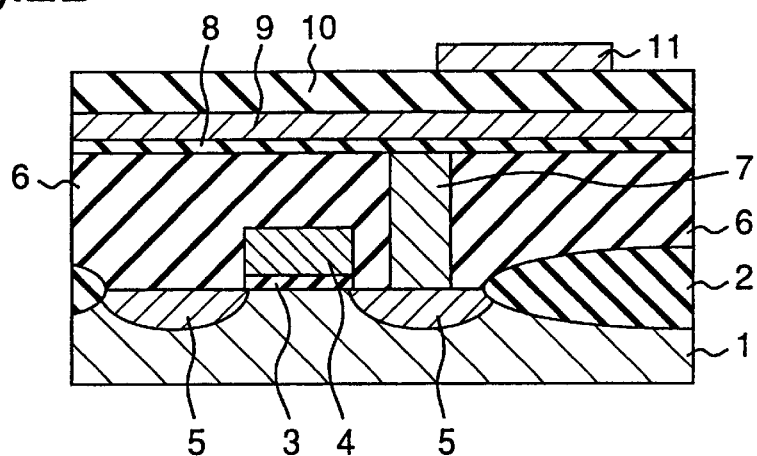

Next, the platinum film 11 serving as an upper electrode is processed by using known photolithography process and dry etching process. An ECR (Electron Cyclotron Resonance) etcher is used for the dry etching, and the electrode size is made 1.3 µm square (FIG. 2B).

Next, heat treatment at 675° C. for 60 minutes in a normal-pressure oxygen-containing atmosphere is carried out with a view to the stabilization of ferroelectric characteristics by the suppression of leak current and the replenishment of oxygen loss. After that, the SBT layer and the lower-electrode and barrier-metal layer are processed also by using the known photolithography process and the dry etching process. The ECR etcher is also used for the dry etching as with the upper-electrode platinum, and the layer sizes are made 2.0 µm square and 2.5 µm square, respectively.

Figure 2C:
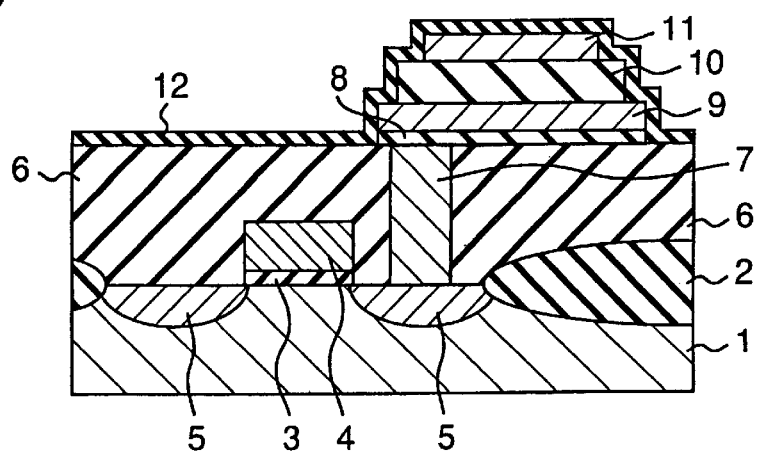

Next, the titanium oxide 12 with a film thickness of 250–500 Å (preferably, 250 Å) is formed as an oxidation barrier layer (FIG. 2C). The titanium oxide 12 is formed by reactive sputtering process, where the sputtering conditions are an argon flow rate of 15 sccm, an oxygen flow rate of 15 sccm and a sputtering power of 1.2 kW. Film thicknesses thinner than 250 Å would cause oxygen to be diffused into the titanium oxide during the subsequent heat treatment in an oxygen-containing atmosphere, posing a problem that the lower electrode or the barrier metal may be oxidized. Film thicknesses thicker than 500 Å may result in too thick a whole film thickness, unfavorably.

Figure 3A:
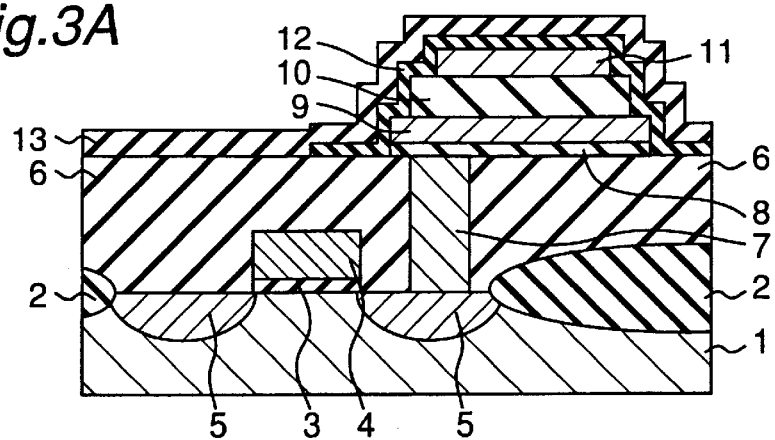
FIGS. 3A, 3B, 3C are partial sectional views of the fabricating process of a semiconductor memory according to the first embodiment of the present invention.

After that, annealing for recovery of process damage is carried out in an oxygen-containing atmosphere. The condition for this heat treatment, although depending on the degree of damage that the capacitor has suffered, may be a temperature of about 500–700° C. The heat treatment this time is carried out at 700° C. for 30 minutes. Subsequently, the second interlayer insulator 13 is formed (FIG. 3A). This second interlayer insulator 13 is made of known ozone TEOS-NSG. After the formation of this NSG, a 0.8 µm contact hole is opened on the platinum film serving as an upper electrode by the known photolithography process and the dry etching process.

Figure 3B:
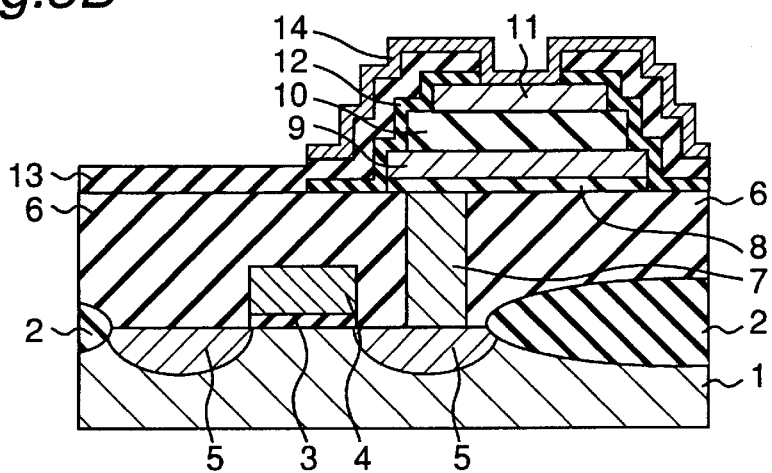
Figure 3C:
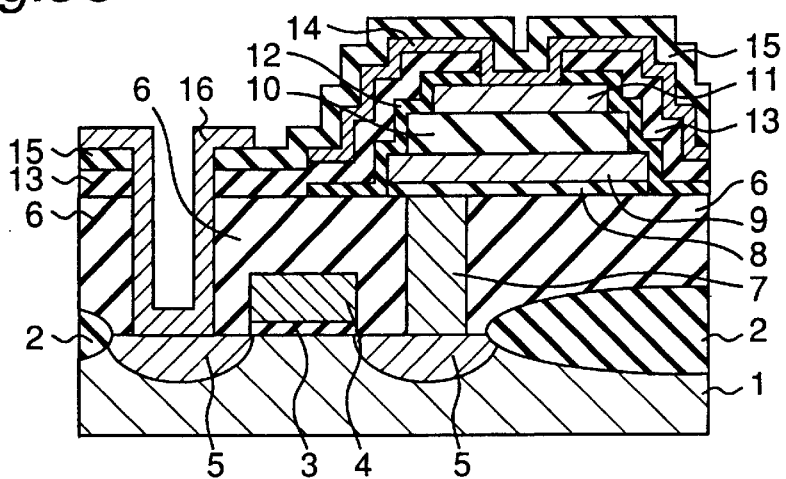

Next, the platinum film 14 is deposited as a drive line, and processed into a specified shape also by the photolithography process and the dry etching process (FIG. 3B). After that, the third interlayer insulator 15 is further formed by an ozone TEOS-NSG film as with the second interlayer insulator 13. Further, a contact hole leading to the platinum film 14 serving as a drive line and the source region of the transistor is opened by the photolithography process and the dry etching process as in the foregoing, and then the aluminum interconnection 16 is implemented (FIG. 3C).

Figure 4:
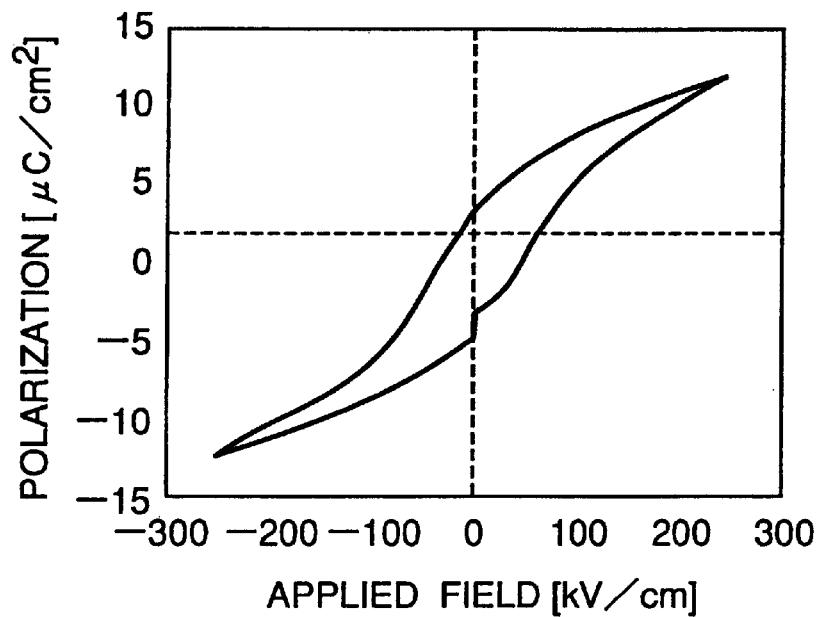
FIG. 4 is a chart showing hysteresis characteristic s of a ferroelectric capacitor according to the first embodiment of the present invention.

Ferroelectric characteristics of a ferroelectric memory device fabricated in this way are shown in FIG. 4. With an applied voltage of ±3 V, characteristic values of 2Pr=8.35 $\mu C/cm^2$ and Ec=42.3 kV/cm were obtained. Next, leak current density of the ferroelectric capacitor was measured. The leak current density at +3 V showed a value of $1.30\times 10^{-7}$ A/cm$^2$. In contrast to these results, when heat treatment was carried out in nitrogen after the processing of the lower electrode and the barrier metal, electrical characteristics were not recovered enough and, in particular, the leak current was recovered only to the order of $10^{-5}$ A/cm$^2$.

In this embodiment, titanium oxide is used as the oxidation barrier layer. However, without being limited to this, the present invention allows the use of oxides comprising one or more kinds of elements out of titanium and tantalum, such as tantalum oxide, or silicon nitride, only if the material has a property of blocking rapid oxidation (oxygen diffusion) of the lower electrode and the barrier metal as well as a property of preventing the diffusion of elements constituting the ferroelectric capacitor outward of the capacitor.

Also, the above description has been made with the use of a nitride of a tantalum-silicon alloy (TaSiN) as the barrier metal layer. However, the present invention not being limited to this, generally similar effects can be expected also by using any one of tantalum nitride (TaN), tungsten nitride (WN), a nitride of a titanium-silicon alloy (TiSiN) and a nitride of a tungsten-silicon alloy (WSiN).

(Second Embodiment)

This embodiment shows a case where titanium nitride is used as the barrier metal layer and silicon nitride is used as the oxidation barrier layer.

After the processes of up to the formation of a polysilicon plug by using known techniques as in the first embodiment, titanium nitride is formed to 2000 Å in thickness as a barrier metal layer by the DC magnetron sputtering process.

After that, iridium is formed to 1500 Å in thickness as a lower electrode also by the DC magnetron sputtering process. Subsequently, an SBT film is formed as a ferroelectric layer. The SBT film is formed by the MOD process. Further, platinum is formed to 1000 Å in thickness as an upper electrode by the DC magnetron sputtering process. After that, an upper electrode is processed by using the known photolithography process and the dry etching process, and then heat treatment is carried out in a normal-pressure oxygen-containing atmosphere. Subsequently, the SBT film, the lower-electrode iridium and the barrier metal layer are processed sequentially.

Next, silicon nitride with a film thickness of 250–500 Å is formed as an oxidation barrier layer. The silicon nitride is formed by the reactive sputtering process, where the sputtering conditions are an argon flow rate of 20 sccm, a nitrogen flow rate of 20 sccm and a sputtering power of 1.0 kW so that the film thickness is made 250–500 Å (preferably, 300 Å). Subsequently, heat treatment with a view to the recovery of process damage is carried out under the conditions of 675° C. and 60 minutes. After this on, processes up to the aluminum interconnection are carried out in the same way as in the first embodiment.

Figure 5:
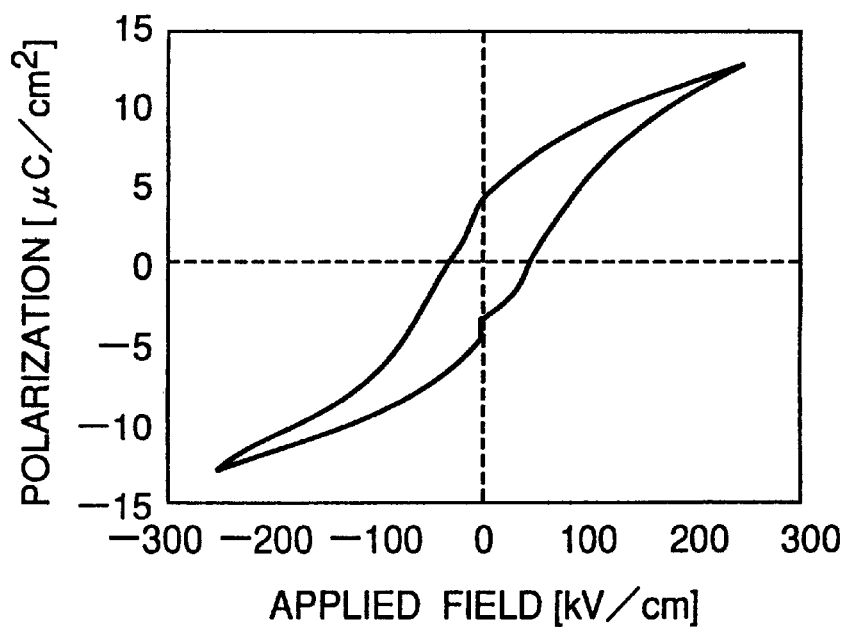
FIG. 5 is a chart showing hysteresis characteristics of a ferroelectric capacitor according to a second embodiment of the present invention.
Figure 6:
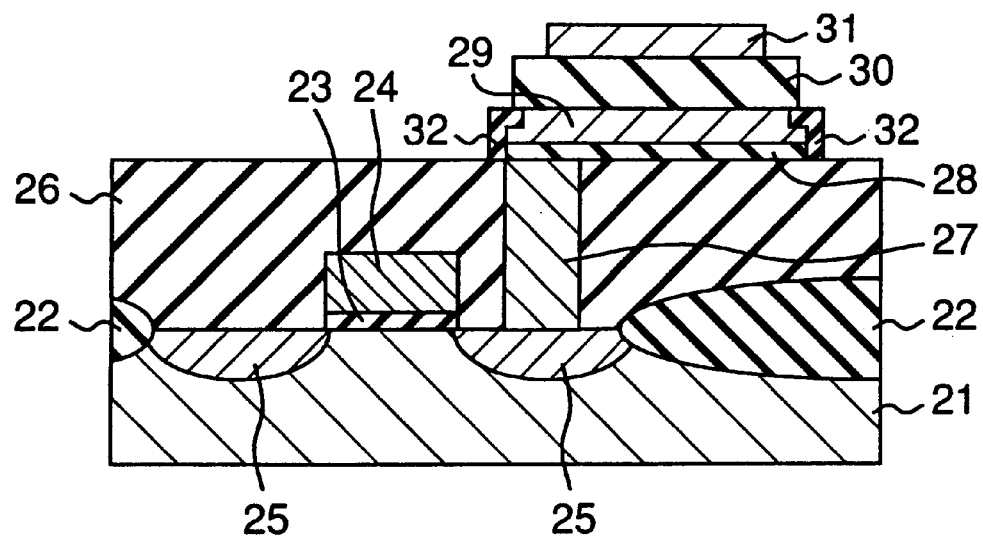
FIG. 6 is a view showing oxidation of a side wall of a conventional ferroelectric capacitor.

Ferroelectric characteristics of a ferroelectric memory device fabricated in this way are shown in FIG. 5. With an applied voltage of ±3 V, characteristic values of 2Pr=7.96 $\mu C/cm^2$ and Ec=43.5 kV/cm were obtained. Next, leak current density of the ferroelectric capacitor was measured. The leak current density at +3 V was $4.7\times 10^{-7}$ A/cm$^2$.

As described in detail hereinabove, use of the present invention makes it possible to carry out the heat treatment process in a high-temperature oxygen-containing atmosphere without oxidizing the lower electrode and the barrier metal layer. Thus, it becomes possible to produce a semiconductor memory equipped with a ferroelectric as a capacitor having good electrical characteristics and high reliability by recovering any damage that the ferroelectric film has suffered during the semiconductor process.

Also, by using an oxide composed of at least one or more kinds of elements out of titanium and tantalum, or silicon nitride, as the oxidation barrier layer, it becomes possible to carry out the heat treatment for recovery of process damage without causing oxidation of the lower electrode and the barrier metal layer.

The invention being thus described, it will be obvious that the same may be varied in many ways. Such variations are not be regarded as a departure from the sprit and scope of the invention, and all such modifications as would be obvious to one skilled in the art are intended to be included within the scope of the following claims.

What is claimed is:

1. A method for fabricating a semiconductor memory in which a transistor is formed on a semiconductor substrate, an interlayer insulator film is formed on the transistor, a contact plug is formed in the interlayer insulator film, a lower electrode film, a ferroelectric film as a capacitor insulator film and an upper electrode film are formed above the interlayer insulator film including the contact plug, a capacitor is formed by sequentially patterning the upper electrode film, the ferroelectric film and the lower electrode film, and the capacitor and the transistor are electrically connected to each other with the contact plug, comprising the steps of:

forming an oxidation barrier layer on the capacitor in such a manner that at least the capacitor is covered with the oxidation barrier layer after forming the capacitor, said oxidation barrier layer being composed of silicon nitride or an oxide of titanium, tantalum, or a combination thereof; and heat treating the in-process semiconductor memory in an oxygen-containing atmosphere after forming the oxidation barrier layer on the capacitor.

2. The method for fabricating a semiconductor memory according to claim 1, wherein film thickness of the oxidation barrier layer is 250 Å or more and 500 Å or less.

3. The method for fabricating a semiconductor memory according to claim 1, wherein the oxidation barrier layer is composed of titanium tantalum oxide.

* * * * *